(12) United States Patent
Gupta

(10) Patent No.: US 10,370,613 B2
(45) Date of Patent: Aug. 6, 2019

(54) GREY CAST IRON-DOPED DIAMOND-LIKE CARBON COATINGS AND METHODS FOR DEPOSITING SAME

(71) Applicant: Parag Gupta, Clinton, MS (US)

(72) Inventor: Parag Gupta, Clinton, MS (US)

(*) Notice: Subject to any disclaimer, the term of this patent is extended or adjusted under 35 U.S.C. 154(b) by 706 days.

(21) Appl. No.: 14/922,099

(22) Filed: Oct. 23, 2015

(65) Prior Publication Data
US 2016/0115417 A1  Apr. 28, 2016

Related U.S. Application Data

(60) Provisional application No. 62/068,233, filed on Oct. 24, 2014.

(51) Int. Cl.
| C23C 14/06 | (2006.01) |
| C23C 14/34 | (2006.01) |
| C10M 103/02 | (2006.01) |

(52) U.S. Cl.
CPC ........... *C10M 103/02* (2013.01); *C23C 14/06* (2013.01); *C23C 14/0605* (2013.01); *C23C 14/3414* (2013.01); *C10M 2201/04* (2013.01); *C10M 2201/0413* (2013.01); *C10M 2201/05* (2013.01); *C10M 2205/028* (2013.01); *C10M 2219/068* (2013.01); *C10M 2223/045* (2013.01); *C10N 2230/06* (2013.01); *C10N 2250/141* (2013.01)

(58) Field of Classification Search
CPC ....... C23C 14/0605–06011; C23C 14/14–205; C23C 14/3407–3414; C10M 103/02; B32B 15/18
See application file for complete search history.

(56) References Cited

U.S. PATENT DOCUMENTS

| 2,533,071 A | 12/1950 | Sykes et al. |
| 4,525,417 A | 6/1985 | Dimigen et al. |
| 4,974,498 A * | 12/1990 | Lemelson ............ B23D 61/185 123/193.6 |
| 5,352,493 A * | 10/1994 | Dorfman ............... A61L 27/306 347/62 |
| 5,851,014 A * | 12/1998 | Germann ............. B62D 55/088 277/406 |
| 2006/0005900 A1* | 1/2006 | Dorfman ................. C22C 26/00 148/400 |
| 2011/0003074 A1 | 1/2011 | Bohling et al. |

(Continued)

FOREIGN PATENT DOCUMENTS

| CN | 101665940 A * | 3/2010 |
| EP | 0856592 | 8/1998 |
| WO | 94012680 | 6/1994 |
| WO | 2005111264 | 11/2005 |

OTHER PUBLICATIONS

Machine Translation of CN101665940A. Mar. 10, 2010. (Year: 2010).*

(Continued)

*Primary Examiner* — Stephen E Rieth
(74) *Attorney, Agent, or Firm* — McDonnell Boehnen Hulbert & Berghoff LLP

(57) ABSTRACT

The disclosure provides grey cast iron-doped diamond-like carbon coating compositions useful for reducing friction and wear in mechanical contact surfaces and methods for deposition of such compositions.

20 Claims, 10 Drawing Sheets

(56) References Cited

U.S. PATENT DOCUMENTS

2011/0094628 A1* 4/2011 Mitsuda ............... C23C 14/027
148/222

OTHER PUBLICATIONS

Wasa, K. et al. Handbook of Sputter Deposition Technology: Fundamentals and Applications for Functional Thin Films, Nanomaterials, and MEMS. Second Edition. 2012. Elsevier Inc. pp. 3-39. (Year: 2012).*

Grill, A. Diamond-like carbon: state of the art. Diamond and Related Materials, 1999, 8, 428-434. (Year: 1999).*

Wasa, K et al. Handbook of Sputter Deposition Technology: Fundamentals and Applications for Functional Thin Films, Nanomaterials, and MEMS. Second Edition. 2012. Elsevier Inc. pp. 41-75. (Year: 2012).*

Austin et al., "The influence of anti-wear additive ZDDP on doped and undoped diamond-like carbon coatings," Surface and Interface Analysis 47(7):755-63 (Jul. 2015).

Lei et al., "Structure and magneto-electrical properties of Fe—C films prepared by magnetron sputtering," Science China 55(9):1594-8 (Sep. 2012).

Liao et al., "Electric field induced sp3-to-sp2 conversion and nonlinear electron transport in iron-doped diamond-like carbon thin film," J. Appl. Phys. 107(1):013709-1-7 (Jan. 2010).

Miyake et al., "Improvement of boundary lubrication properties of diamond-like carbon (DLC) films due to metal addition," Tribology International 37(9):751-61 (Sep. 2004).

Ren at al., "Preparation and Property of a Fe-Doped DLC Multilayer by Ion Sources," Materials Science Forum 654:1908-11 (Jun. 2010).

Wan et al., "An electrochemical strategy to incorporate iron into diamond like carbon films with magnetic properties,"Electrochem. Commun. 11(1):99-102 (Jan. 2009).

\* cited by examiner

GREY CAST IRON-DOPED DIAMOND-LIKE CARBON COATINGS AND METHODS FOR DEPOSITING SAME

CROSS-REFERENCE TO RELATED APPLICATION

This application claims the benefit of priority to U.S. Provisional Patent Application Ser. No. 62/068,233, filed Oct. 24, 2014, the disclosure of which is incorporated herein by reference in their entirety.

BACKGROUND OF THE INVENTION

Field of the Invention

This disclosure relates to compositions of doped diamond-like carbon (DLC) coatings, and methods of depositing doped DLC coatings onto substrates. In particular, this disclosure relates to the deposition of grey cast iron-doped DLCs onto substrates.

Description of Related Art

In any system involving mechanical contact (e.g., piston-ring assemblies in an internal combustion engine, tool dies in a lathe, etc.), the reduction of friction and wear of contact surfaces is highly desirable. This reduction can be effected by the use of lubricants and/or surface coatings.

The use of amorphous carbon coatings is a well-established field. Generally, carbon coatings have a high melting point, high hardness, chemical and electrical inertness, high smoothness, and high density. Amorphous carbon coatings may be deposited by a variety of methods, including cathodic arc evaporation, plasma enhanced chemical vapor deposition, chemical vapor deposition, reactive magnetron physical vapor deposition, and non-reactive magnetron physical vapor deposition.

Amorphous carbon coatings may be hydrogenated, for example, by physical vapor deposition in the presence of a reactive gas such as methane or acetylene (i.e., reactive physical vapor deposition). Hydrogen termination of dangling carbon bonds on a coating surface lower friction coefficients, but limits the surface interaction with lubricants designed for ferrous surfaces.

Amorphous carbon coatings with a high $sp^3$ carbon content are considered "diamond-like" carbon (DLC) coatings. Such coatings offer lower friction and wear characteristics at the expense of adhesion to ferrous materials (e.g., steel). To address this, metallic interlayers or transition layers are applied to the substrate before DLC deposition.

SUMMARY OF THE INVENTION

There remains a need for diamond-like carbon (DLC) coatings that adhere strongly to substrates, and offer improved friction and wear characteristics in both lubricated and unlubricated conditions. The inventor has found that silicon-containing iron alloy-doped DLCs have low residual stress and facilitate adhesion to substrates. For example, the inclusion of iron alloy comprising silicon (Si) in DLCs provides iron (Fe) atoms available to interact with lubricants. Thus, in a broad aspect, the present disclosure provides iron alloy-doped DLCs that possess improved wear characteristics in both lubricated and unlubricated mechanical contact applications.

In one aspect, the present invention disclosure a coating composition comprising DLC and a grey cast iron (GCI) alloy, wherein the GCI alloy comprises about 1 at. % to about 6 at. % carbon and about 0.5 at. % to about 4 at. % silicon. In certain aspects, the total Fe content of the coating composition is present in an amount of about 0.1 at. % to about 49.9 at. %.

In another aspect, the present disclosure provides a method for forming a GCI-doped DLC coating, comprising sputtering a composite target onto a substrate in the presence of a reactive gas, wherein the composite target comprises graphite and a GCI alloy.

These and other features and advantages of the present disclosure will be more fully understood from the following detailed description taken together with the accompanying claims. It is noted that the scope of the claims is defined by the recitations therein and not by the specific discussion of features and advantages set forth in the present description.

DETAILED DESCRIPTION OF THE INVENTION

Figure 1:
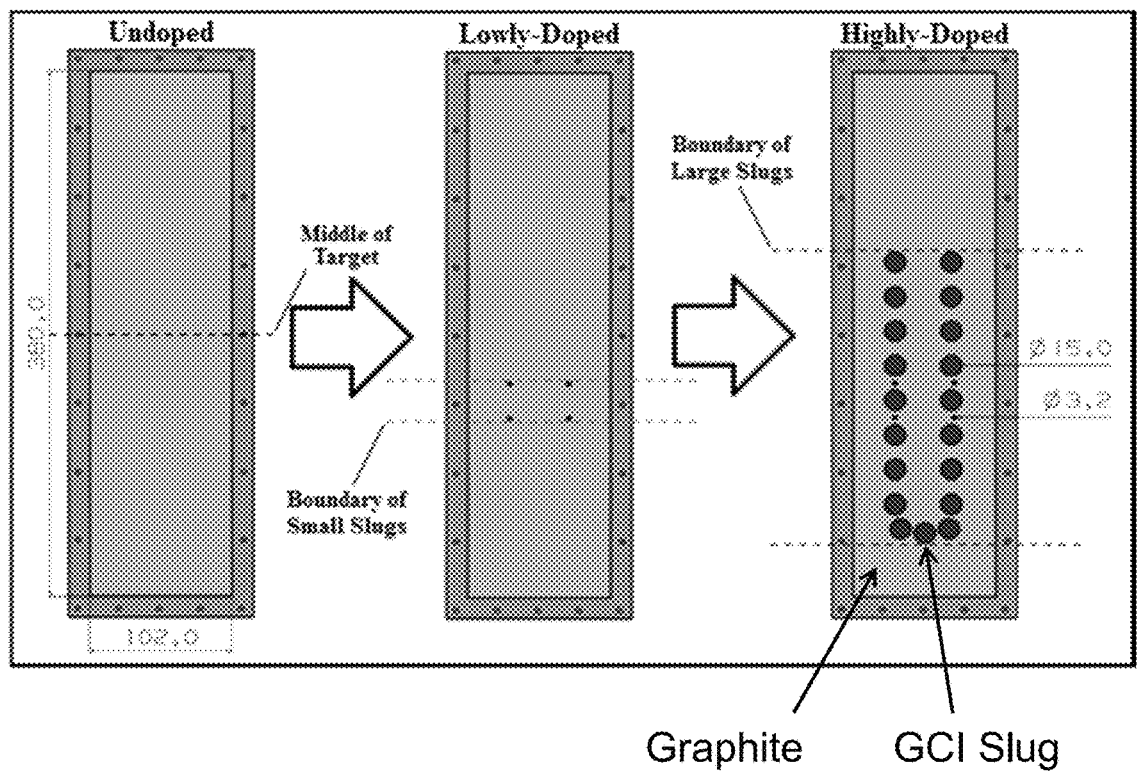
FIG. 1 shows a schematic representation of the composite target of Examples 1-4.

Before the disclosed methods and materials are described, it is to be understood that the aspects described herein are not limited to specific embodiments, apparati, or configurations, and as such can, of course, vary. It is also to be understood that the terminology used herein is for the purpose of describing particular aspects only and, unless specifically defined herein, is not intended to be limiting.

Throughout this specification, unless the context requires otherwise, the word "comprise" and "include" and variations (e.g., "comprises," "comprising," "includes," "including") will be understood to imply the inclusion of a stated component, feature, element, or step or group of components, features, elements or steps but not the exclusion of any other integer or step or group of integers or steps.

As used in the specification and the appended claims, the singular forms "a," "an" and "the" include plural referents unless the context clearly dictates otherwise.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

All percentages, ratios and proportions herein are by relative atomic ratio, unless otherwise specified. An atomic percent (atomic %, also at. %) of a component, unless specifically stated to the contrary, is based on the percentage of one element relative to the whole composition.

As used herein, the term "diamond-like carbon" (DLC) refers to amorphous carbon with a high $sp^3$ carbon content (e.g., greater than or equal to 30% of total carbon).

As used herein, the term "doped" refers to the inclusion of an element in an amount of 49.9 at. % or less.

As used herein, "sputtering" refers to the deposition process wherein particles are ejected from a solid target material due to bombardment of the target by energetic particles (e.g., argon plasma ions), and are subsequently deposited onto a substrate.

As used herein, "reactive sputtering" refers to the sputtering process wherein sputtering is carried out in the presence of a reactive gas, such that the target material may react with the reactive gas during the deposition process. If a hydrocarbon gas (e.g., acetylene) is present as the reactive gas when depositing DLC, the reactive gas contributes both carbon and hydrogen to the deposited material, affording hydrogenated DLC. The type of reactive gas and flow rate of reactive gas are both adjustable parameters.

As used herein, "physical vapor sputtering" refers to the sputtering process wherein plasma is generated from an inert gas (e.g., argon, xenon, or krypton) using a negatively charged electrode configured below the target surface and an optionally negatively charged substrate holder. Plasma ions are accelerated towards and strike the surface of the target, ejecting target material to be deposited onto a substrate. The type of inert gas, flow rate of inert gas, target voltage and power, and substrate voltage and power are all adjustable parameters. Power may be applied to the target and/or substrate in DC or RF form, the latter of which is a type of AC.

As used herein, "magnetron sputtering" refers to the physical vapor sputtering process wherein a magnetic field traps electrons in front of the target, providing a dense plasma close to the surface of the sputtering target.

As used herein, "bonding interlayer" refers to a coating deposited onto a substrate before deposition of DLC, intended to facilitate adhesion of DLC to the substrate. The bonding interlayer can be applied to the substrate by any means, including sputtering.

One aspect of the disclosure is a diamond-like carbon (DLC) coating composition. The coating composition can be useful, for example, as a coating for contact surfaces, as described in more detail below. The DLC coating composition contains grey cast iron (GCI) alloy. The GCI alloy contains carbon in a range of about 1 at. % to about 6 at. % and silicon in a range of about 0.5 at. % to about 4 at. %.

As described above, the GCI contains carbon in a range of about 1 at. % to about 6 at. %. In certain embodiments, the carbon in GCI may be present in the range of about 2.5 at. % to about 4 at. %, or about 2.5 at. %, or about 3 at. %, or about 3.5 at. %, or about 4 at. %, based on the total composition of the GCI alloy.

As described above, the GCI contains silicon in a range of about 0.5 at. % to about 4 at. %. In certain embodiments, the silicon in GCI may be present in a range of about 1 at. % to about 3 at. %, or about 1 at. %, or about 1.5 at. %, or about 2 at. %, or about 2.5 at. %, or about 3.0 at. %, based on the total composition of the GCI alloy.

In certain embodiments, the GCI alloy may further contain copper in an amount of less than about 10 at. %, and/or manganese in an amount of less than about 3 at. %.

As described above, the GCI may further contain copper in an amount of less than about 10 at. %. In certain embodiments, the copper in GCI may be present in an amount of less than about 7.5 at. %, or an amount less than about 5 at. %, or an amount less than about 2.5 at. %, or an amount less than about 1 at. %, or about 1 at. %, or about 0.75 at. %, or about 0.5 at. %, or about 0.25 at. %, or about 0.1 at. %, based on the total composition of the GCI alloy.

As described above, the GCI may further contain manganese in amount of less than 3 at. %. In certain embodiments, the manganese in GCI may be present in an amount of less than about 2.5 at. %, or an amount less than about 2 at. %, or an amount less than about 1.5 at. %, or an amount less than about 1 at. %, or about 1 at. %, or about 0.75 at. %, or about 0.5 at. %, or about 0.25 at. %, or about 0.1 at. %, based on the total composition of the GCI alloy.

In certain embodiments the GCI alloy may contain additional elements, each in an amount of less than 2.5% at. %. Examples of such elements include, but are not limited to, chromium, magnesium, molybdenum, nickel, phosphorous, and sulfur.

As described above, Fe is present in the DLC coating composition in a range of about 0.1 at. % to about 49.9 at. %. In certain embodiments, Fe may be present in the coating composition in the range of about 0.1 at. % to about 35 at. %, or about 0.1 at. % to about 28 at. %, or about 0.1 at. % to about 12 at. %, or about 0.1 at. % to about 9 at. %, or about 0.1 at. % to about 6 at. %, or about 0.1 at. % to about 5 at. %, or about 0.1 at. % to about 4 at. %, or about 0.1 at. % to about 3 at. %, or about 0.1 at. % to about 2.5 at. %, or about 0.1 at. % to about 2 at. %, or about 0.1 at. % to about 1.5 at. %, or about 12 at. % to about 49.9 at. %, or about 12 at. % to about 35 at. %, or about 12 at. % to about 28 at. %, or about 28 at. % to about 35 at. %, or about 35 at. %, or about 32 at. %, or about 30 at. %, or about 28 at. %, or about 26 at. %, or about 24 at. %, or about 22 at. %, or about 20 at. %, or about 18 at. %, or about 16 at. %, or about 14 at. %, or about 12 at. %, or about 10 at. %, or about 8 at. %, or about 6 at. %, or about 4 at. %, or about 2 at. %, or about 1.9 at. %, or about 1.8 at. %, or about 1.7 at. %, or about 1.6 at. %, or about 1.5 at. %, or about 1.4 at. %, or about 1.3 at. %, or about 1.2 at. %, or about 1.1 at. %, or about 1 at. %, or about 0.9 at. %, or about 0.8 at. %, or about 0.7 at. %, or about 0.6 at. %, or about 0.5 at. %, or about 0.4 at. %, or about 0.3 at. %, or about 0.2 at. %, or about 0.1 at. %, based on the total composition of the DLC coating composition.

In an exemplary embodiment, the GCI alloy comprises about 2.5 at. % to about 4 at. % carbon, about 1 at. % to about 3 at. % silicon, about 0.2 at. % to about 1.2 at. % manganese, and about 0.1 at. % to about 0.5 at. % copper, based on the total composition of the GCI alloy, and the total Fe content of the DLC coating composition is about 0.1 at. % to about 40 at. %, based on the total composition of the DLC coating composition. In certain embodiments, the GCI alloy comprises about 3.6 at. % carbon, about 2.6 at. % silicon, about 0.7 at. % manganese, and about 0.25 at. % copper, based on the total composition of the GCI alloy, and the total Fe content of the DLC coating composition is about 35 at. %, or about 28 at. %, or about 12 at. %, or about 1.5 at. %, or about 1.1 at. %, or about 0.8 at. %, based on the total composition of the DLC coating composition.

In certain embodiments, the DLC included in the DLC coating composition is hydrogenated.

In certain embodiments, the DLC included in the DLC coating is not hydrogenated.

In certain embodiments, the DLC coating composition is deposited onto a silicon substrate. Examples of suitable silicon substrates include, but are not limited to, Si(100), Si(110), Si(111), p-type Si(100), p-type Si(110), p-type Si(111), n-type Si(100), n-type Si(110), and n-type Si(111).

In certain embodiments, the DLC coating composition is deposited onto Si(111) wafers and the total Fe content of the DLC coating composition is between 0.1 at. % and 1.8 at. %.

In other embodiments, the DLC coating composition is deposited onto a steel alloy substrate. Examples of suitable steel alloy substrates include, but are not limited to, plain carbon steels, alloy steels, stainless steel, Damascus steel, and tool steels. Examples of tool steels include, but are not limited to, H-13 steel and 52100 steel.

In certain embodiments, a bonding interlayer is deposited between a steel alloy substrate and the DLC coating composition. Examples of suitable bonding interlayers include, but are not limited to, silicon, silicon carbide, silicon nitride, chromium, chromium nitride, titanium, titanium carbide, titanium nitride, tungsten, molybdenum, niobium, silver, and aluminum. In one embodiment, the bonding interlayer is titanium.

In one embodiment, the DLC coating composition is deposited onto a H-13 steel alloy flat substrate, wherein the substrate comprises a Ti bonding interlayer between the DLC coating composition and steel substrate, and the total Fe content of the DLC coating composition is about 35 at. %, or about 28 at. %, or about 13 at. %, or about 12 at. %.

Another aspect of the disclosure is a method of forming a DLC coating, comprising sputtering a composite target onto a substrate in the presence of a reactive gas, wherein the composite target comprises graphite and a GCI alloy as described in any one of preceding embodiments. In some embodiments, the GCI alloy comprises carbon in a range of about 1 at. % to about 6 at. %, silicon in a range of about 0.5 at. % to about 4 at. %. The GCI alloy may further comprise copper in an amount of less than about 10 at. %, and/or manganese in an amount of less than about 3 at. %.

The reactive gas suitable for the use in the methods of the disclosure is carbon dioxide, oxygen, nitrogen, or a hydrocarbon gas. Examples of suitable hydrocarbon gases include, but are not limited to, methane and acetylene.

The reactive gas may be introduced into a deposition chamber at a flow rate in the range of about 0.5 sccm to about 20 sccm, or about 0.5 sccm to about 15 sccm, or about 1 sccm to about 10 sccm, or about 1 sccm to about 8 sccm, or about 1 sccm to about 5 sccm, or about 8 sccm, or about 5 sccm, or about 1 sccm.

The GCI alloy and graphite may be concentrated in sectors and organized on the target such that the concentration of Fe in the sputtered DLC coating varies across the substrate.

In certain embodiments, GCI alloy is concentrated in sectors and organized on the target such that the GCI alloy is subjected to maximum plasma ion bombardment in a sputtering process.

In certain embodiments, about 1 mm to about 20 mm diameter cylindrical GCI alloy slugs are press-fit into a graphite sputtering target.

As described above, about 1 mm to about 20 mm diameter cylindrical GCI alloy slugs may be incorporated into a graphite sputtering target. In certain embodiments, the GCI alloy slugs may be about 1 mm to about 15 mm, or about 1 mm to about 10 mm, or about 1 mm to about 7.5 mm, or about 1 mm to about 5 mm, or about 2 mm to about 5 mm, or about 3 mm to about 4 mm, or about 5 mm to about 20 mm, or about 10 mm to about 20 mm, or about 12 mm to about 18 mm, or about 14 mm to about 16 mm, or about 1 mm, or about 2 mm, or about 3 mm, or about 4 mm, or about 5 mm, or about 10 mm, or about 11 mm, or about 12 mm, or about 13 mm, or about 14 mm, or about 15 mm, or about 16 mm, or about 17 mm, or about 18 mm, or about 19 mm, or about 20 mm.

In certain embodiments, the cylindrical GCI alloy slugs are press-fit into a graphite sputtering target.

In certain embodiments, the cylindrical GCI alloy slugs are arranged on a graphite sputtering target according to FIG. 1, "Lowly-Doped," or FIG. 1, "Highly-Doped."

In certain embodiments, the DLC coating is deposited onto a silicon substrate. Examples of suitable silicon substrates include, but are not limited to, Si(100), Si(110), Si(111), p-type Si(100), p-type Si(110), p-type Si(111), n-type Si(100), n-type Si(110), and n-type Si(111).

In other embodiments, the DLC coating composition is deposited onto a steel alloy substrate. Examples of suitable steel alloy substrates include, but are not limited to, plain carbon steels, alloy steels, stainless steel, Damascus steel, and tool steels. Examples of tool steels include, but are not limited to, H-13 steel and 52100 steel.

In certain embodiments, a bonding interlayer is deposited between a steel alloy substrate and the DLC coating composition. Examples of suitable bonding interlayers include, but are not limited to, silicon, silicon carbide, silicon nitride, chromium, chromium nitride, titanium, titanium carbide, and titanium nitride, tungsten, molybdenum, niobium, silver, and aluminum. In one embodiment, the bonding layer is titanium.

In certain embodiments, the composite target may be conditioned and/or cleaned to remove contaminants before sputtering. In certain embodiments, the surface of the substrate may be subjected to argon sputter etching to remove contaminants before depositing the bonding interlayer or DLC coating.

In certain embodiments, the sputtering is magnetron sputtering.

In certain embodiments, magnetron sputtering is performed with a target power of about 0.5 kW to about 8 kW, or about 1 kW to about 5 kW or about 1 kW to about 3 kW, or about 1 kW, or about 2 kW, or about 3 kW, or about 4 kW, or about 5 kW.

In certain embodiments, magnetron sputtering is performed with a substrate bias of about −500 V to about −25 V, or about −350 V to about −25 V, or about −250 V to about −25 V, or about −250 V to about −50 V, or about −200 V to about −100 V, or about −200 V to about −25 V, or about −150

V to about −25 V, or about −100 V to about −25 V, or about −200 V, or about −175 V, or about −150 V, or about −125 V, or about −100 V, or about −75 V, or about −50 V, or about −25 V.

In certain embodiments, magnetron sputtering is performed with a deposition time of about 500 s to about 30,000 s, or about 500 s to about 20,000 s, or about 500 s to about 15,000 seconds, or about 500 s to about 10,000 s, or about 500 s to about 7,500 s, or about 500 s to about 5,000 s, or about 500 s to about 3,000 s, or about 500 s to about 2,000 s, or about 1000 s to about 2000 s, or about 1,000 s to about 20,000 s, or about 1,000 to about 15,000 s, or about 1,000 to about 10,000 s, or about 2,500 to about 10,000 s, or about 5,000 to about 10,000 s, or about 6,000 to about 9,000 s, or about 5,000 to about 20,000, or about 7,500 to about 17,500, or about 10,000 to about 15,000, or about 500 s, or about 750 s, or about 1000 s, or about 1250 s, or about 1500 s, or about 1750 s, or about 2000 s, or about 2250 s, or about 2500 s, or about 5,000 s, or about 6,000 s, or about 7,000 s, or about 8,000 s, or about 9,000 s, or about 10,000 s, or about 11,000, or about 12,000, or about 13,000, or about 14,000, or about 15,000.

In certain embodiments, the bonding interlayer and DLC coating are deposited sequentially in a dual-target magnetron physical vapor sputtering chamber.

In certain embodiments, the GCI-doped DLC coating is useful in reducing the wear on mechanical contact surfaces relative to a undoped DLC coating, under both lubricated and unlubricated conditions.

In certain embodiments, the GCI-doped DLC coating composition is effective in reducing the wear on a steel ball substrate sliding on a steel flat substrate under lubricated conditions, relative to a undoped DLC coating.

In certain embodiments, the DLC coating composition is effective in reducing the wear on a steel ball substrate sliding on a steel flat substrate under unlubricated conditions, relative to a undoped DLC coating.

The invention will be further described in the following examples, which do not limit the scope of the invention described in the claims.

EXAMPLES

The Examples that follow are illustrative of specific embodiments of the invention, and various uses thereof. They are set forth for explanatory purposes only, and are not to be taken as limiting the invention.

Example 1—"Lowly-Doped" GCI-Doped DLC Coating

Cylindrical slugs were sheared from a GCI rod and polished to a surface roughness of about 1 μm. The slugs were lathed to a diameter of 3.2 mm and a height of about 0.25 cm. Four slugs were press-fit into a graphitic target such that the polished surface of the slug was flush with the surface of the graphite, in locations according to FIG. 1, "Lowly-Doped."

Following modification, the composite target and was loaded into a dual-target magnetron physical vapor sputtering chamber. Target conditioning was performed according to the following steps:
  A. The unloaded substrate holder was introduced into the deposition chamber and rotated at 10.5 rpm.
  B. Ar gas was fed into the chamber at 100.0 sccm and stabilized.
  C. 0.1 kW of power was applied to the graphite target for ≈600 s. Target voltage and number of arc events were recorded in situ.
  D. If the target voltage stabilized, then 0.2 kW of power was applied to the graphite target for ≈600 s, and the target voltage and number of arc events were recorded. Otherwise, Step C. was repeated.
  E. Power ramping in this manner continued from 0.5 to 3.5 kW in 0.5 kW increments.
  F. Ar gas was shut off, and the unloaded substrate holder rotation was discontinued.
  G. The unloaded substrate holder was removed from the deposition chamber, immediately loaded, and reintroduced into the deposition chamber for argon sputter etching.

In this case, the substrate was a Si(111) wafer. Following target conditioning, argon sputter etching of the substrate was performed according to the following steps:
  H. The substrate-loaded substrate holder was rotated at 10.5 rpm.
  I. Ar gas was fed into the chamber at 100.0 sccm and stabilized.
  J. 1.0 kW of power was applied to the substrate holder for ≈600 s.
  K. Ar gas was shut off, and the substrate-loaded substrate holder rotation was discontinued.
  L. The substrate-loaded substrate holder remained in place for deposition.

The GCI-doped DLC was deposited onto the substrate according to the following steps:
  M. The substrate-loaded substrate holder, having already been introduced into the deposition chamber, was rotated at 10.5 rpm.
  N. Ar gas was fed into the chamber at 100.0 sccm and stabilized.
  O. Acetylene gas was fed into the chamber at a rate "$AF_{EX1}$" and stabilized. Partial pressures of all species were recorded in situ.
  P. A power "$P_{EX1}$" was applied to the composite target, followed ~30 s later by application of a power necessary to induce a substrate bias "$SB_{EX1}$" upon the substrate holder, where both power applications were simultaneously applied for a time "$T_{EX1}$." Target voltage, number of arc events, and partial pressures of all species were recorded in situ.
  Q. Ar gas and acetylene gas were shut off, and the substrate-loaded substrate holder rotation was discontinued.
  R. The substrate-loaded substrate holder was removed from the deposition chamber.

Seven coatings were deposited according to Example 1, with the following parameters:

TABLE 1

| Coating | $AF_{EX1}$ (sccm) | $P_{EX1}$ (kW) | $SB_{EX1}$ (V) | $T_{EX1}$ (s) |
| --- | --- | --- | --- | --- |
| Ex 1-1 | 1 | 1 | −50 | 1500 |
| Ex 1-2 | 1 | 1 | −150 | 1500 |
| Ex 1-3 | 8 | 1 | −50 | 1500 |
| Ex 1-4 | 1 | 3 | −50 | 1500 |
| Ex 1-5 | 1 | 3 | −150 | 1500 |
| Ex 1-6 | 8 | 3 | −50 | 1500 |
| Ex 1-7 | 8 | 3 | −150 | 1500 |

The coating composition of each sample was characterized after deposition:

TABLE 2

| Coating | Fe (at. %) | Non-C Elemental Composition (at. %) | Hardness (GPa) |
|---|---|---|---|
| Ex 1-1 | 0.9 | 2.2% Ar Trace Si | 12.46 ± 0.25 |
| Ex 1-2 | 0.8 | 3.7% Ar Trace Si | 13.50 ± 0.21 |
| Ex 1-3 | 0.3 | 1.5% Ar Trace Si | 15.60 ± 0.24 |
| Ex 1-4 | 1.6 | 3.4% Ar Trace Mn, Cu, Si | 21.40 ± 0.63 |
| Ex 1-5 | 1.5 | 3.6% Ar Trace Mn, Cu, Si | 22.85 ± 0.17 |
| Ex 1-6 | 1.1 | 2.1% Ar Trace Mn, Cu, Si | 23.90 ± 0.16 |
| Ex 1-7 | 1.0 | 2.6% Ar Trace Si | 25.25 ± 0.30 |

Figure 3A:
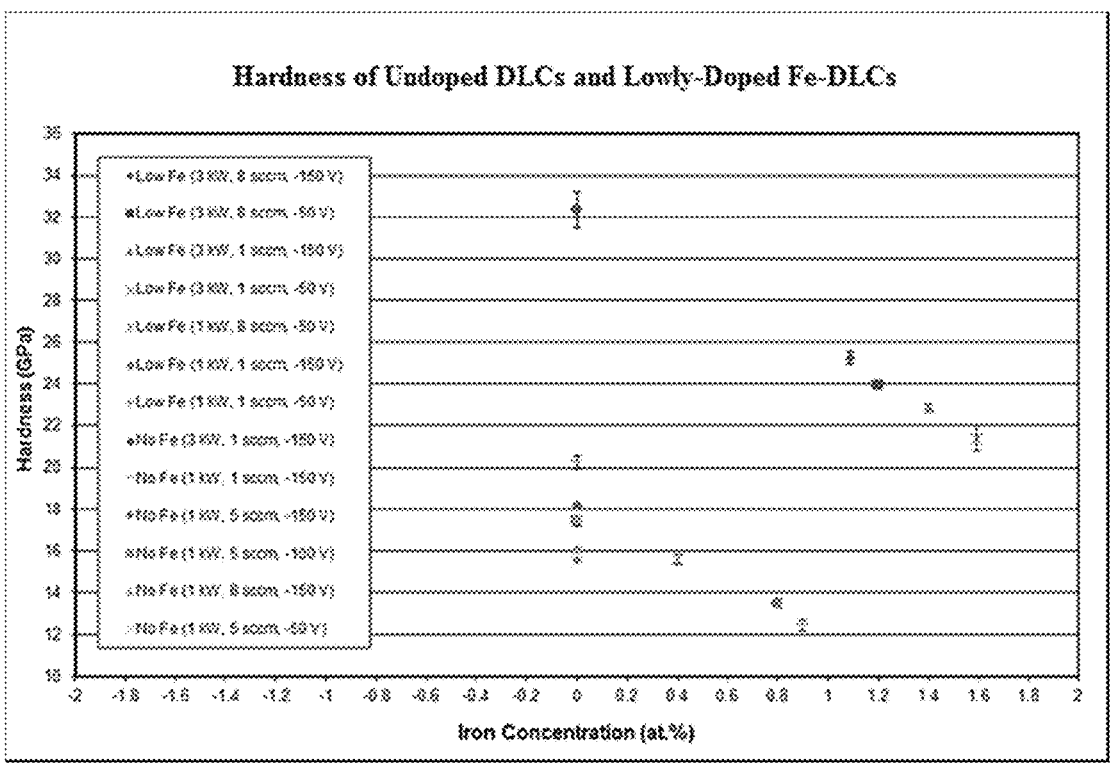
FIG. 3A shows a graph depicting the hardness of DLC coatings deposited in Examples 1 and 4.
Figure 3B:
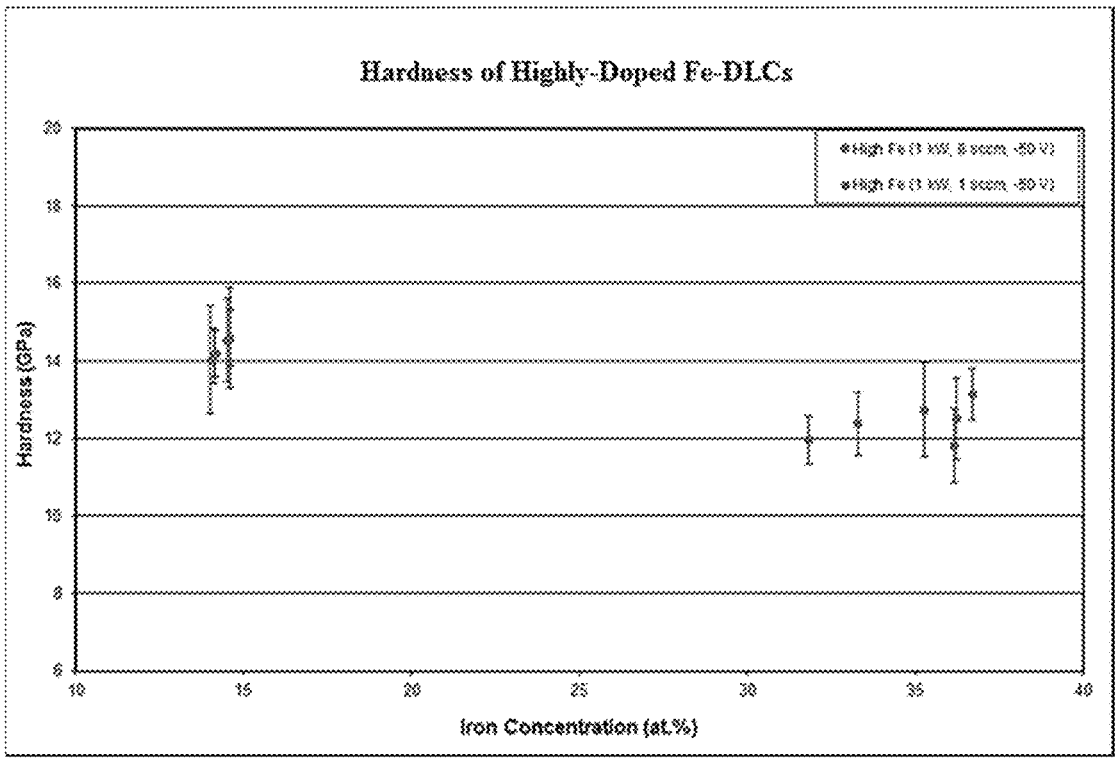
FIG. 3B shows a graph depicting the hardness of DLC coatings deposited in Example 2.
Figure 4A:
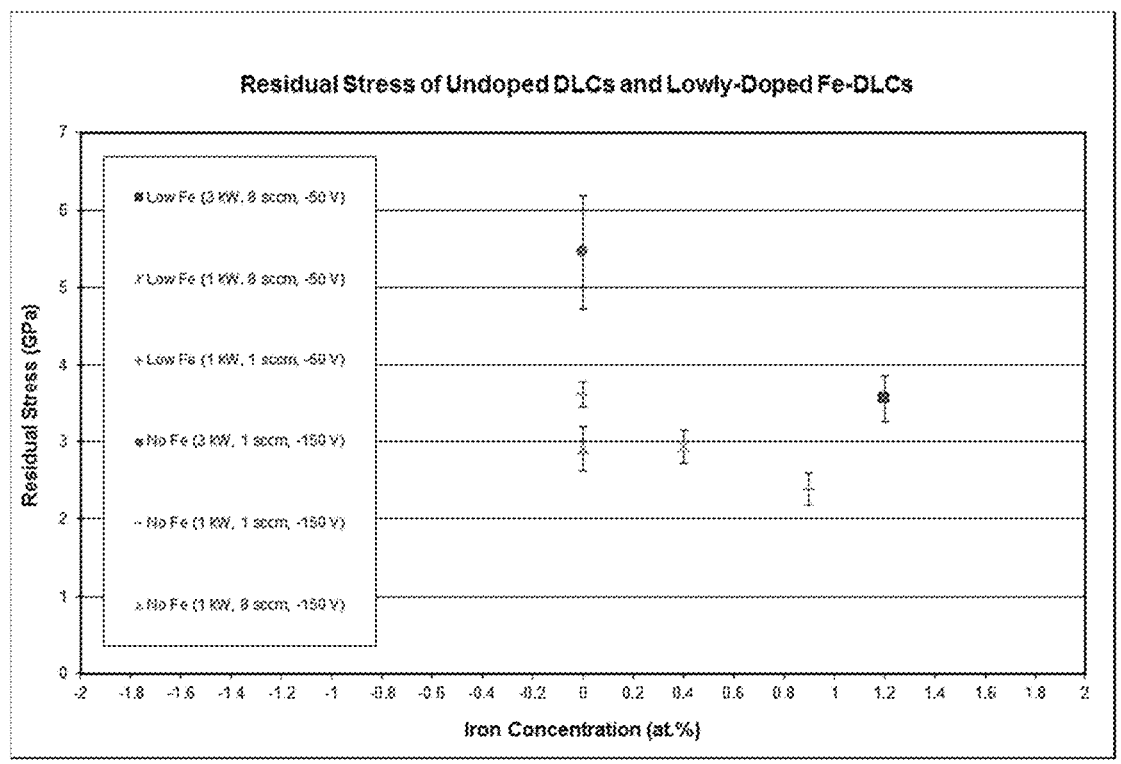
FIG. 4A shows a graph depicting the residual stress of DLC coatings deposited in Examples 1 and 4.
Figure 4B:
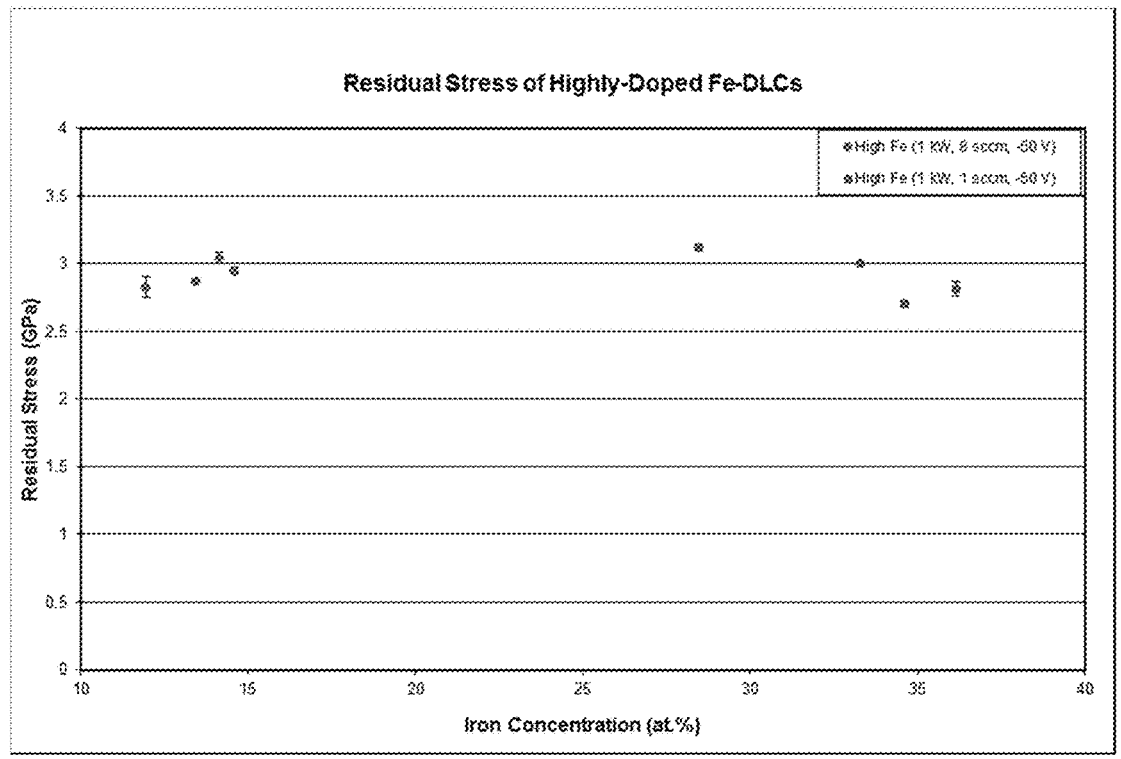
FIG. 4B shows a graph depicting the residual stress of DLC coatings deposited in Example 2.

The hardness and residual stress of each coating was measured, and the results are presented in FIG. 3-4.

Example 2—"Highly-Doped" GCI-Doped DLC Coating

Cylindrical slugs were sheared from a GCI rod and polished to a surface roughness of about 1 μm. The slugs were lathed to a diameter of 15 mm and a height of about 0.25 cm. Nineteen slugs were press-fit into the graphitic target of Example 1 graphitic target such that the polished surface of the slug was flush with the surface of the graphite, in locations according to FIG. 1, "Highly-Doped." The four 3.2 mm slugs press-fit into the target in Example 1 remained in place.

Following modification, the composite target was loaded into a dual-target magnetron physical vapor sputtering chamber. Coupled target conditioning and cleaning was performed according to the following steps:

A. The unloaded substrate holder was introduced into the deposition chamber and rotated at 10.5 rpm.
B. Ar gas and $N_2$ gas were fed into the chamber at 50.0 sccm each and stabilized.
C. 0.1 kW of power was applied to the graphite target for ≈600 s. Target voltage and number of arc events were recorded in situ.
D. If the target voltage stabilized, then 0.2 kW of power was applied to the graphite target for ≈600 s, and the target voltage and number of arc events were recorded. Otherwise, Step C. was repeated.
E. Power ramping in this manner continued from 0.5 to 1.5 kW in 0.5 kW increments.
F. $N_2$ gas was shut off, and Ar was fed into the chamber at 100.0 sccm and stabilized.
G. 0.1 kW of power was applied to the graphite target for ≈600 s. Target voltage and number of arc events were recorded in situ.
H. If the target voltage stabilized, then 0.2 kW of power was applied to the graphite target for ≈600 s, and the target voltage and number of arc events were recorded. Otherwise, Step H. was repeated.
I. Power ramping in this manner continued from 0.5 to 1.5 kW in 0.5 kW increments.
J. 0.1 kW of power was applied to the titanium target for ≈600 s. Target voltage and number of arc events were recorded in situ.
K. If the target voltage stabilized, then 0.2 kW of power was applied to the titanium target for ≈600 s, and the target voltage and number of arc events were recorded. Otherwise, Step K. was repeated.
L. Power ramping in this manner continued from 0.5 to 1.5 kW in 0.5 kW increments.
M. Ar gas was shut off, and the unloaded substrate holder rotation was discontinued.
N. The unloaded substrate holder was removed from the deposition chamber, immediately loaded, and reintroduced into the deposition chamber.

In this case, a H-13 steel flat substrate was loaded in Step N.

To facilitate DLC adhesion, a Ti interlayer was deposited onto the etched H-13 steel flat substrate according to the following steps:

O. The substrate-loaded substrate holder, having already been introduced into the deposition chamber, was rotated at 10.5 rpm.
P. Ar gas was fed into the chamber at 100.0 sccm and stabilized.
Q. 1.0 kW of power was applied to the titanium target, followed ≈30 s later by a power necessary to induce a substrate bias "$SB_{TI}$" upon the substrate holder, where both power applications were simultaneously applied for ≈600 s total process time. Target voltage, number of arc events, and partial pressures of all species were recorded in situ.
R. Ar gas was shut off, and the substrate-loaded substrate holder rotation was discontinued.
S. The substrate-loaded substrate holder remained in place for further deposition.

In Example 2, $SB_{TI}$ was −50 V.

The GCI-doped DLC was then deposited onto the Ti-coated substrate according to the following steps:

T. The substrate-loaded substrate holder, having already been introduced into the deposition chamber, was rotated at 10.5 rpm.
U. Ar gas was fed into the chamber at 100.0 sccm and stabilized.
V. Acetylene gas was fed into the chamber at "$AF_{EX2}$" and stabilized. Partial pressures of all species were recorded in situ.
W. An undefined power necessary to induce a substrate bias "$SB_{EX2}$" upon the substrate holder, was applied and followed ~30 s later by a power "$P_{EX2}$" applied to the composite target, where both power applications were simultaneously applied for a time "$T_{EX2}$." Target voltage, number of arc events, and partial pressures of all species were recorded in situ.
X. Ar gas and acetylene gas were shut off, and the substrate-loaded substrate holder rotation was discontinued.
Y. The substrate-loaded substrate holder was removed from the deposition chamber.

Two coatings were deposited according to Example 2, with the following parameters:

TABLE 3

| Coating | $AF_{EX2}$ (sccm) | $P_{EX2}$ (kW) | $SB_{EX2}$ (V) | $T_{EX2}$ (s) |
|---|---|---|---|---|
| Ex 2-1 | 1 | 1 | −50 | 12600 |
| Ex 2-2 | 8 | 1 | −50 | 7950 |

Figure 2:
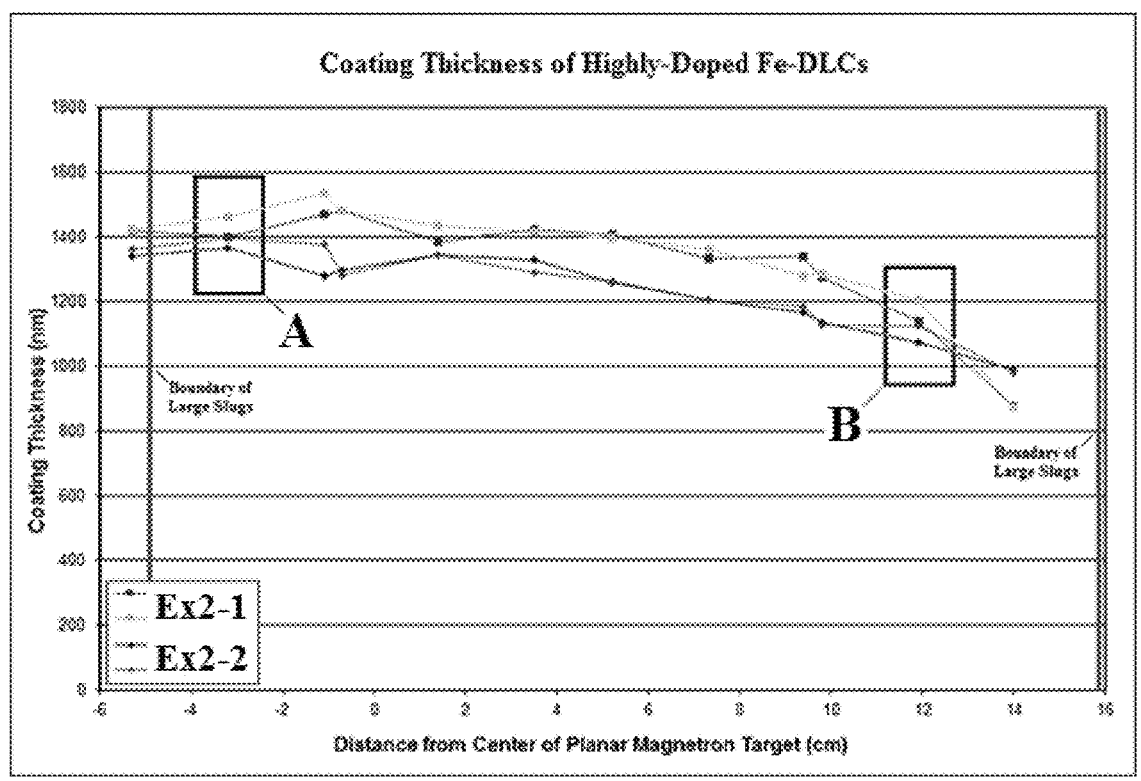
FIG. 2 shows a graph depicting the thickness of the DLC coating deposited in Example 2 and specifying the points at which samples were collected for Tests 1-5.

The composite target configuration and deposition parameters described above resulted in a doped DLC coating wherein the Fe concentration varied along the length of the substrate holder, to a greater extent than that observed in Example 1. Samples were taken from two different points on along the substrate holder length and characterized (FIG. 2):

TABLE 4

| Coating | Fe (at. %) | Non-C Elemental Composition (at. %) | Ti Interlayer Thickness (nm) | Hardness (GPa) | Elastic Modulus (GPa) |
|---|---|---|---|---|---|
| Ex 2-1A | 28 | 2.5% Ar 1.0% Si Trace Mn, Cu | 150 | 12.39 ± 0.82 | 160.32 ± 8.76 |
| Ex 2-1B | 35 | 2.2% Ar 1.3% Si Trace Mn, Cu | 100 | 11.81 ± 0.94 | 159.98 ± 8.59 |
| Ex 2-2A | 12 | 2.0% Ar 0.5% Si Trace Mn, Cu | 150 | 14.42 ± 0.71 | 142.53 ± 4.19 |
| Ex 2-2B | 13 | 1.7% Ar 0.7% Si Trace Mn, Cu | 100 | 16.38 ± 1.29 | 155.96 ± 6.92 |

The hardness and residual stress of each coating was measured, and the results are shown in FIG. 3-4. Without being limited to a particular theory, it is believed that the silicon included in GCI, which binds to carbon more strongly than iron, is contributory to the consistent, low residual stresses of "highly-doped" GCI-doped DLC coatings.

Example 3—"Highly-Doped" GCI-Doped DLC Coating

Steps A-Y were carried out according to Example 2. In this case, a 52100 steel ball substrate was loaded in step N.

Two coatings were deposited according to Example 2, with the following parameters:

TABLE 5

| Coating | $AF_{EX2}$ (sccm) | $P_{EX3}$ (kW) | $SB_{EX3}$ (V) | $T_{EX3}$ (S) |
|---|---|---|---|---|
| Ex 3-1 | 1 | 1 | −50 | 12600 |
| Ex 3-2 | 8 | 1 | −50 | 7950 |

The 52100 steel ball substrates were positioned in the substrate holder such that four samples could be collected in which the coating compositions were essentially identical to those measured in Example 2.

TABLE 6

| Coating | Fe (at. %) | Non-C Elemental Composition (at. %) | Ti Interlayer Thickness (nm) |
|---|---|---|---|
| Ex 3-1A | 28 | 2.5% Ar 1.0% Si Trace Mn, Cu | 150 |
| Ex 3-1B | 35 | 2.2% Ar 1.3% Si Trace Mn, Cu | 100 |
| Ex 3-2A | 12 | 2.0% Ar 0.5% Si Trace Mn, Cu | 150 |
| Ex 3-2B | 13 | 1.7% Ar 0.7% Si Trace Mn, Cu | 100 |

Example 4—"Undoped" Comparative DLC Coating

An unmodified graphite target was loaded into a dual-target magnetron physical vapor sputtering chamber. Target conditioning and argon sputter etching of the substrate were performed according to Example 1, steps A-L. In this case, the substrate was a Si(111) wafer.

The DLC was deposited onto the substrate according to the following steps:

M. The substrate-loaded substrate holder, having already been introduced into the deposition chamber, was rotated at 10.5 rpm.
N. Ar gas was fed into the chamber at 100.0 sccm and stabilized.
O. Acetylene gas was fed into the chamber at "$AF_{EX3}$" and stabilized. Partial pressures of all species were recorded in situ.
P. A power "P" was applied to the graphite target, followed ~30 s later by a power necessary to induce a substrate bias "$SB_{EX3}$" upon the substrate holder, where both power applications were simultaneously applied for a time "$T_{EX3}$." Target voltage, number of arc events, and partial pressures of all species were recorded in situ.
Q. Ar gas and acetylene gas were shut off, and the substrate-loaded substrate holder rotation was discontinued.
R. The substrate-loaded substrate holder was removed from the deposition chamber.

6 coatings were deposited according to Example 2, with the following parameters:

TABLE 7

| Coating | $AF_{EX4}$ (sccm) | $P_{EX4}$ (kW) | $SB_{EX4}$ (V) | $T_{EX4}$ (s) |
|---|---|---|---|---|
| Ex 4-1 | 1 | 1 | −150 | 1500 |
| Ex 4-2 | 5 | 1 | −50 | 1500 |
| Ex 4-3 | 5 | 1 | −100 | 1500 |
| Ex 4-4 | 5 | 1 | −150 | 1500 |
| Ex 4-5 | 8 | 1 | −150 | 1500 |
| Ex 4-6 | 1 | 3 | −150 | 1500 |

The composition of each coating was characterized after deposition:

TABLE 8

| Coating | Fe (at. %) | Non-C Elemental Composition (at. %) | Hardness (GPa) |
|---|---|---|---|
| Ex 4-1 | 0 | — | — |
| Ex 4-2 | 0 | 0.3% Ar | 15.53 ± 0.05 |
| Ex 4-3 | 0 | 0.8% Ar | 17.40 ± 0.21 |
| Ex 4-4 | 0 | 1.2% Ar | 18.18 ± 0.13 |
| Ex 4-5 | 0 | 1.6% Ar | 16.10 ± 0.04 |
| Ex 4-6 | 0 | 2.8% Ar | 32.33 ± 0.87 |

The hardness and residual stress of each coating was measured, and provided in FIG. 3-4.

Test 1

Figure 5:
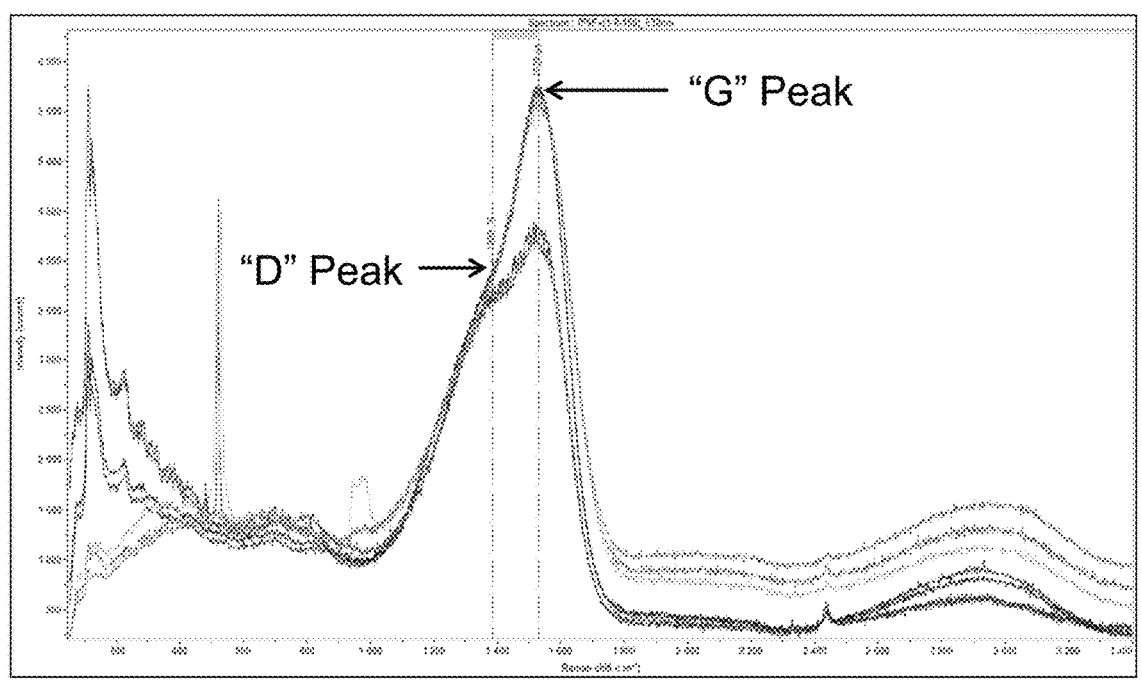
FIG. 5 shows the Raman spectra of DLC coatings deposited in Examples 1-4, collected for Test 1. The characteristic "G" and "D" peaks of DLC are indicated.
Figure 6A:
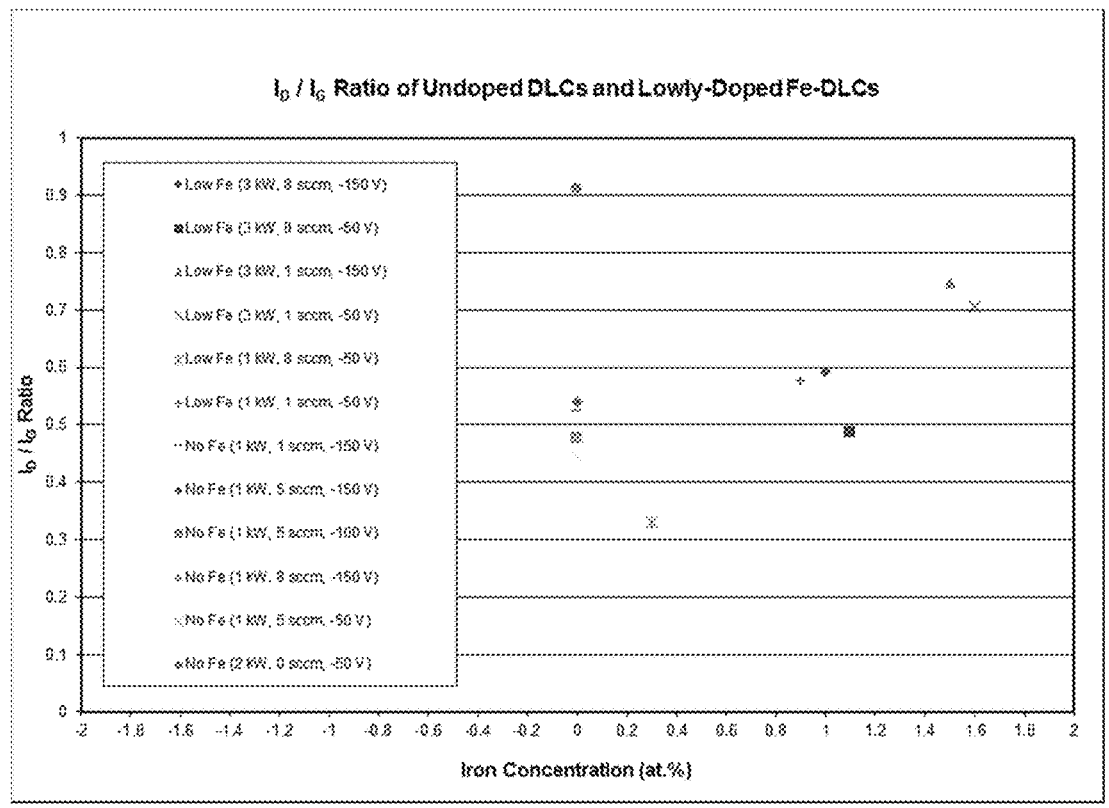
FIG. 6A shows a graph depicting the results of Test 1, the $I_D/I_G$ ratio of DLC coatings deposited in Examples 1 and 4, including one extra sample for reference not specifically referenced elsewhere.
Figure 6B:
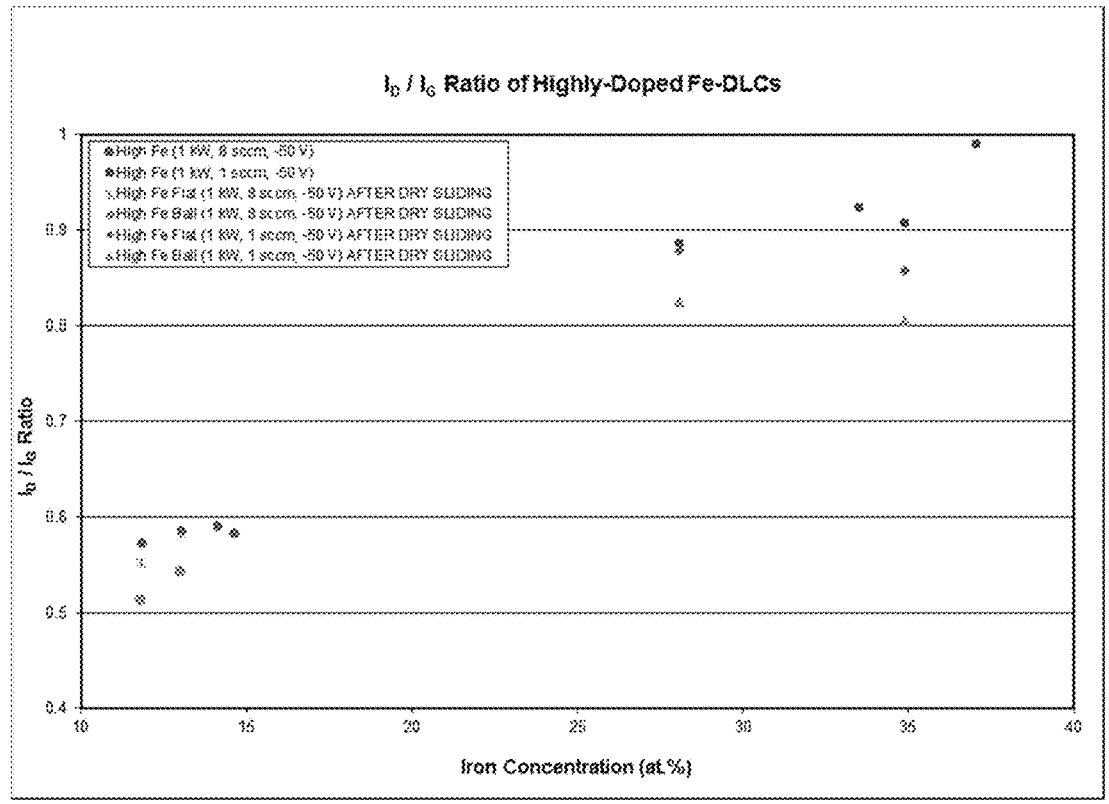
FIG. 6B shows a graph depicting the results of Test 1, the $I_D/I_G$ ratio of DLC coatings deposited in Examples 2 and 3.

Raman spectroscopy was performed on the GCI-doped DLC coated substrate to determine the ratio of dispersion of the G and D peaks ($I_D/I_G$), an indicator of the sp$^3$ carbon content of the DLC (FIG. 5-6).

The test results demonstrate that $I_D/I_G$ generally increases with increasing total Fe at. %, and corresponding increasing total Si content. It is understood that the relative sp$^3$ carbon content of DLC is inversely proportional to $I_D/I_G$. Without being limited to a particular theory, it is believed that the silicon included in GCI is contributory for the decrease in relative sp³ carbon.

Test 2

Figure 7A:
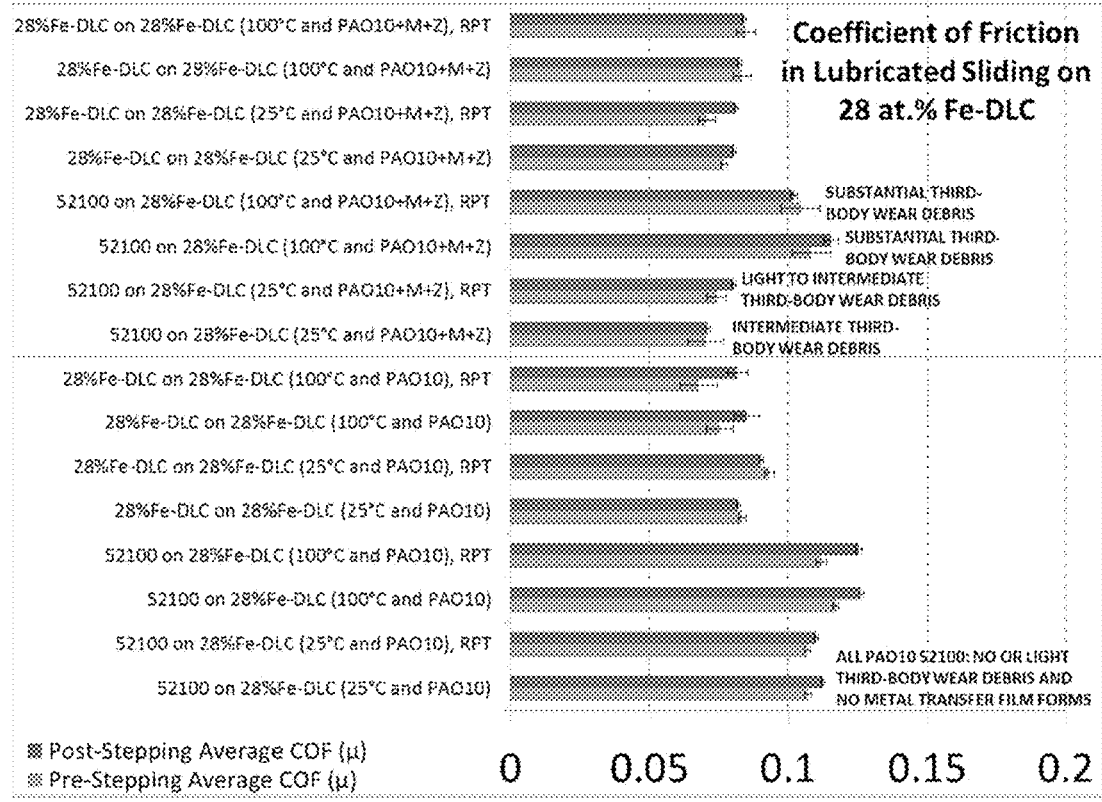
FIG. 7A shows a graph depicting the results of Test 2 involving GCI-doped DLC coatings.
Figure 7B:
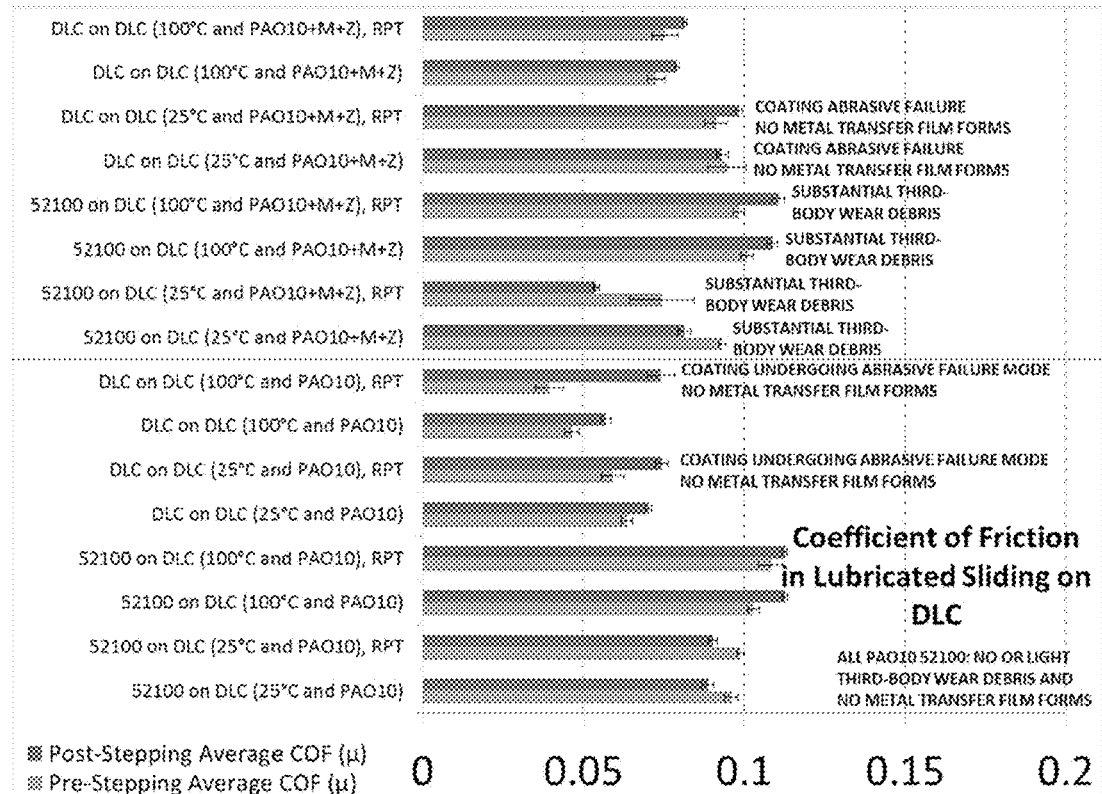
FIG. 7B shows a graph depicting the results of Test 2 involving undoped DLC coatings.

The coefficient of friction (COF) between uncoated 52100 steel ball substrates and Ex2-1A and the COF between Ex3-1A and Ex2-1A was measured in lubricated conditions in the presence of poly-alpha olefin grade 30 synthetic oil (PAO10) with and without the presence of 0.5 wt. % MoDTC and 0.5 wt. % ZDDP (FIG. 7A). A corresponding set of measurements was made using commercial, undoped DLC deposited on 52100 steel ball and H-13 steel flat substrates (FIG. 7B).

The test results demonstrate that, under lubricated conditions, "highly-doped" GCI-doped DLC coatings have a slightly negative or a negligible effect on COFs relative to undoped DLC coatings.

Test 3

Figure 8A:
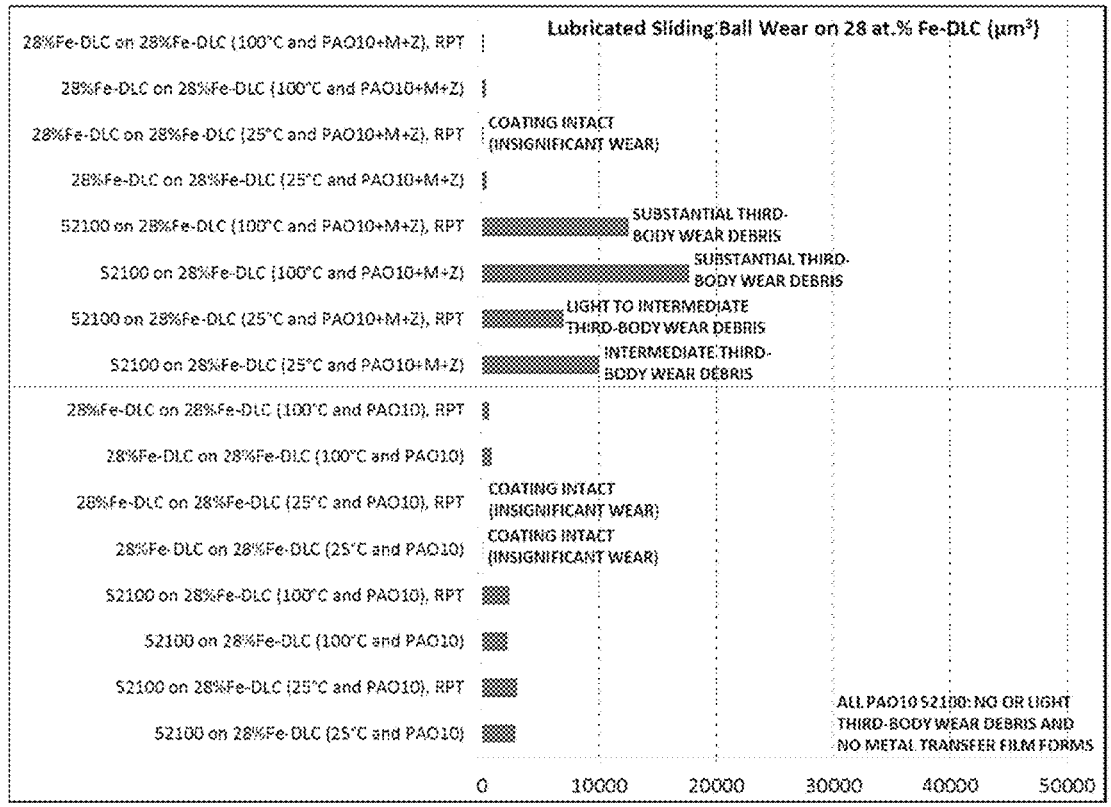
FIG. 8A shows a graph depicting the results of Test 3 involving GCI-doped DLC coatings.
Figure 8B:
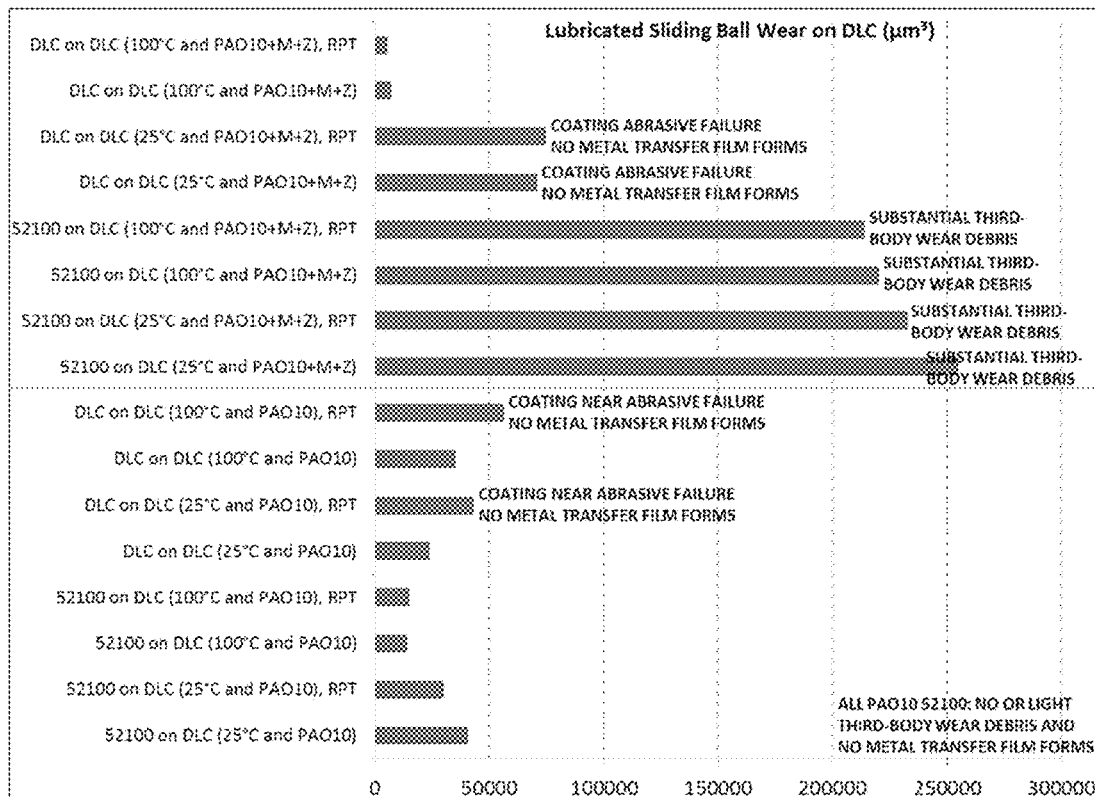
FIG. 8B shows a graph depicting the results of Test 3 involving undoped DLC coatings.

The sliding ball wear of uncoated 52100 steel ball substrates and Ex2-1A and the sliding ball wear of Ex3-1A on Ex2-1A was measured in lubricated conditions in the presence of poly-alpha olefin grade 30 synthetic oil (PAO10) with and without the presence of 0.5 wt. % MoDTC and 0.5 wt. % ZDDP (FIG. 8A). A corresponding set of measurements was made using commercial, undoped DLC deposited on 52100 steel ball and H-13 steel flat substrates (FIG. 8B).

Surprisingly, the test results demonstrated that, under lubricated conditions, "highly-doped" GCI-doped DLC coatings have a significantly positive effect on contact surface wear relative to commercial, undoped DLC coatings. All wear measurements on systems involving Ex2-1A and an uncoated steel substrate were below 20,000 µm³, and measurements on systems involving only Ex3-1A and Ex2-1A were below 3,000 µm³. In comparison, wear measurements on systems involving undoped DLC coatings and a steel substrate were as high as 250,000 µm³, and measurements on systems involving only undoped DLCs ranged from 5,000 µm³ to 70,000 µm³. Without being limited to a particular theory, it is believed that the silicon included in GCI binds to carbon more strongly than iron, making iron atoms in the DLC coating more available for interaction with lubricants.

Test 4

Figure 9A:
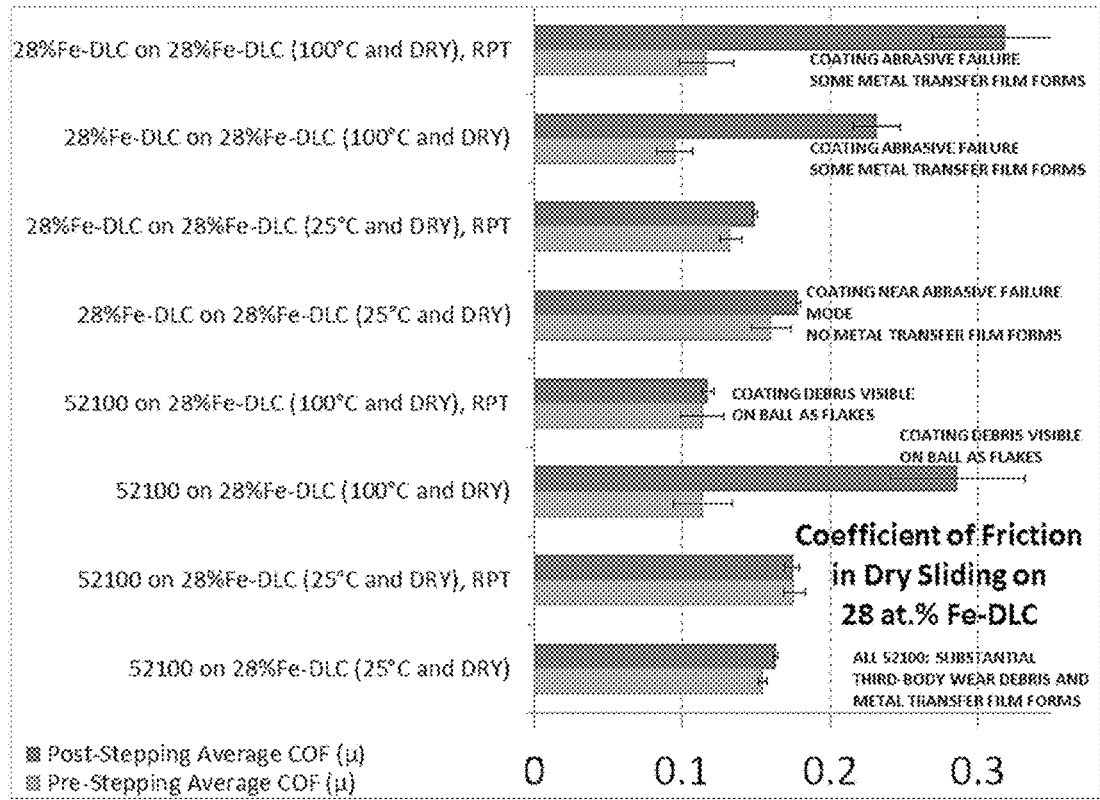
FIG. 9A shows a graph depicting the results of Test 4 involving GCI-doped DLC coatings.
Figure 9B:
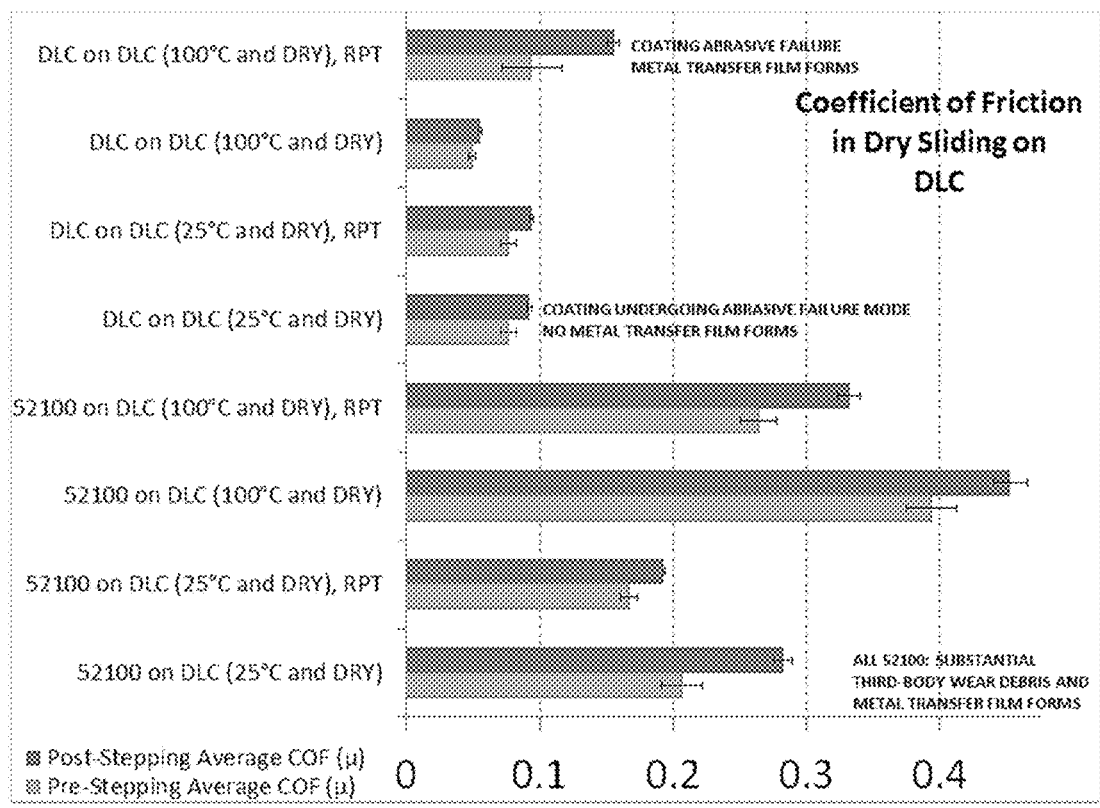
FIG. 9B shows a graph depicting the results of Test 4 involving undoped DLC coatings.

The coefficient of friction (COF) between uncoated 52100 steel ball substrates and Ex2-1A and the COF between Ex3-1A and Ex2-1A was measured in unlubricated conditions (FIG. 9A). A corresponding set of measurements was made using commercial, undoped DLC deposited on 52100 steel ball and H-13 steel flat substrates (FIG. 9B).

Surprisingly, the test results demonstrated that "highly-doped" GCI-doped DLC coatings have a positive effect on COFs between a coated substrate and an uncoated steel substrate relative to undoped DLC coatings, and a negative effect on COFs between two coated substrates, relative to undoped DLC coatings.

Test 5

Figure 10A:
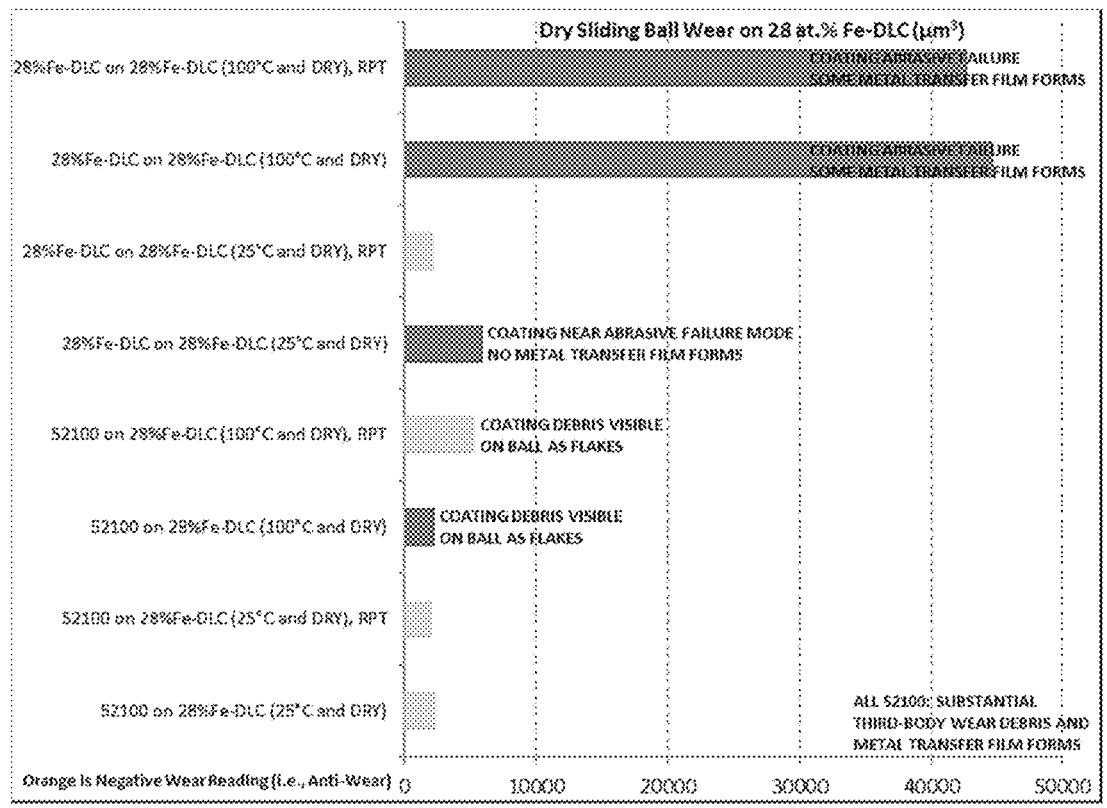
FIG. 10A shows a graph depicting the results of Test 5 involving GCI-doped DLC coatings.
Figure 10B:
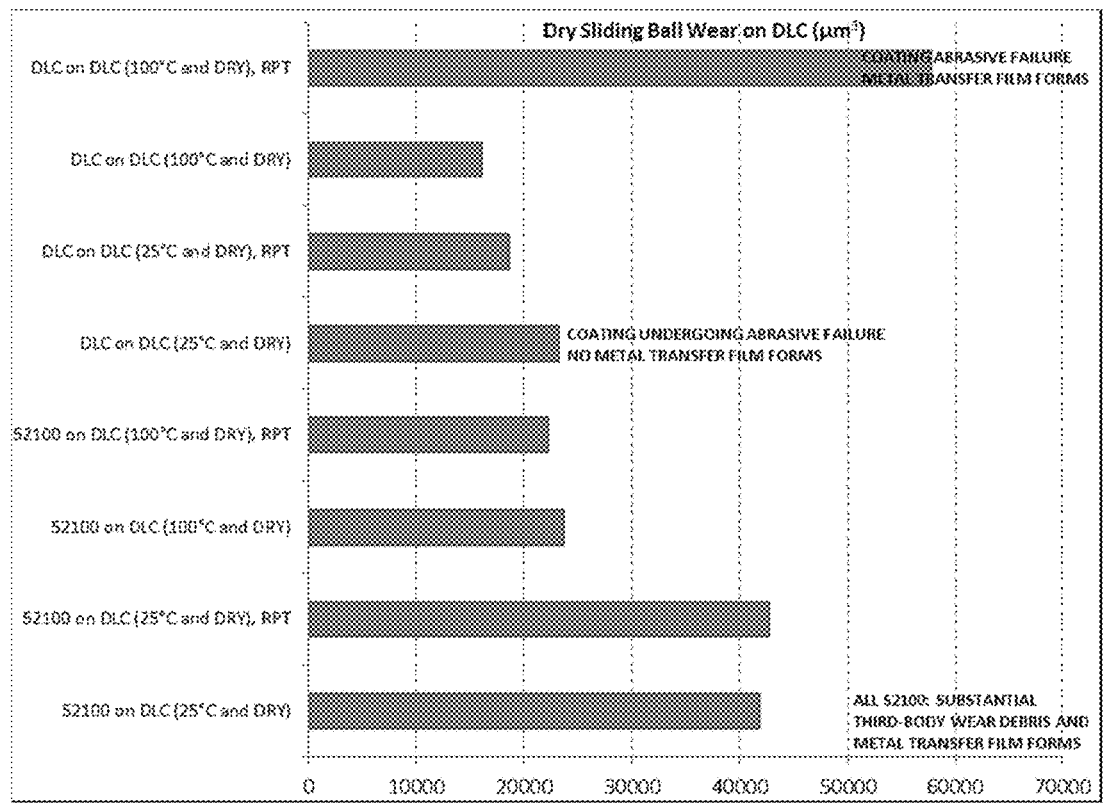
FIG. 10B shows a graph depicting the results of Test 5 involving undoped DLC coatings.

The sliding ball wear of uncoated 52100 steel ball substrates and Ex2-1A and the sliding ball wear of Ex3-1A on Ex2-1A was measured in unlubricated conditions (FIG. 10A). A corresponding set of measurements was made using commercial, undoped DLC deposited on 52100 steel ball and H-13 steel flat substrates (FIG. 10B).

Surprisingly, the test results demonstrated that, even under unlubricated conditions, "highly-doped" GCI-doped DLC coatings have a positive effect on contact surface wear relative to commercial, undoped DLC coatings. While the effect is diminished from that observed under lubricated conditions, it is still significant. In most cases tested, wear measurements involving GCI-doped DLC coatings were below 7,000 µm³, while no measurement involving undoped DLC coatings was below 10,000 µm³.

It is understood that the examples and embodiments described herein are for illustrative purposes only and that various modifications or changes in light thereof will be suggested to persons skilled in the art and are to be incorporated within the spirit and purview of this application and scope of the appended claims. All publications, patents, and patent applications cited herein are hereby incorporated herein by reference for all purposes.

What is claimed is:

1. An article comprising a coating composition disposed adjacent a substrate, the substrate comprising a steel alloy or an Si surface and the coating composition comprising diamond-like carbon (DLC); wherein
the coating composition is produced by sputtering a composite target onto the substrate in the presence of a reactive gas;
the composite target comprises graphite and a GCI alloy; and
the GCI alloy comprises carbon in a range of about 1 at. % to about 6 at. % and silicon in a range of about 0.5 at. % to about 4 at. %.

2. The article of claim 1, wherein the GCI alloy comprises carbon in a range of about 2.5 at. % to about 4 at. % and silicon in an amount of about 1 at. % to about 3 at. %.

3. The article of claim 1, wherein the GCI alloy comprises carbon in an amount of about 3.6 at. % and silicon in an amount of about 2.6 at. %.

4. The article of claim 1, wherein the total Fe content in the coating composition is present in an amount of about 0.1 at. % to about 49.9 at. %.

5. The article of claim 1, wherein the total Fe content in the coating composition is present in an amount of about 0.1 at. % to about 35 w.t %.

6. The article of claim 1, wherein the total Fe content in the coating composition is present in an amount of about 12 at. % to about 35 at. %.

7. The article of claim 1, wherein the total Fe content in the coating composition is present in an amount of about 0.1 at. % to about 1.8 at. %.

8. The article of claim 1, wherein the DLC is hydrogenated.

9. The article of claim 1, wherein the substrate comprises an Si surface.

10. The article of claim 1, wherein the substrate comprises a steel alloy.

11. The article of claim 1, wherein the substrate further comprises a bonding interlayer, wherein the coating composition is deposited on the bonding interlayer of the substrate.

12. The article of claim 11, wherein the bonding interlayer is Ti.

13. The article of claim 1, wherein the reactive gas is acetylene.

14. The article of claim 1, wherein the GCI alloy and graphite are concentrated in sectors and organized on the target such that the concentration of Fe in the sputtered DLC coating varies across the substrate.

15. The article of claim 1, wherein the sputtering is magnetron sputtering.

16. A method of forming a diamond-like carbon (DLC) coating, comprising sputtering a composite target onto a substrate in the presence of a reactive gas, wherein the composite target comprises graphite and a GCI alloy, wherein the GCI alloy comprises carbon in a range of about 1 at. % to about 6 at. % and silicon in a range of about 0.5 at. % to about 4 at. % wherein the substrate comprises a steel alloy or an Si surface.

17. The method of claim 16, wherein the reactive gas is acetylene.

18. The method of claim 16, further comprising sputtering a bonding interlayer onto the substrate before sputtering the composite target.

19. The method of claim 18, wherein the bonding interlayer is Ti.

20. The method of claim 16, wherein the sputtering is magnetron sputtering.

* * * * *